US010875762B2

(12) United States Patent
Sarma et al.

(10) Patent No.: US 10,875,762 B2
(45) Date of Patent: Dec. 29, 2020

(54) ADDRESSABLE DISPLAY SYSTEM FOR ICA MONITORING AND ANNUNCIATION FOR CERTIFIED APPLICATIONS RUNNING ON A PERSONAL ELECTRONIC DEVICE

(71) Applicant: HONEYWELL INTERNATIONAL INC., Morris Plains, NJ (US)

(72) Inventors: Kalluri R. Sarma, Mesa, AZ (US); Richard Berckefeldt, Paola, KS (US); Willard R. True, Kirkland, WA (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 167 days.

(21) Appl. No.: 15/928,615

(22) Filed: Mar. 22, 2018

(65) Prior Publication Data
US 2019/0177157 A1 Jun. 13, 2019

Related U.S. Application Data

(63) Continuation of application No. 62/595,623, filed on Dec. 7, 2017.

(51) Int. Cl.
*B81B 3/00* (2006.01)
*H04B 7/185* (2006.01)
(Continued)

(52) U.S. Cl.
CPC .............. *B81B 3/0083* (2013.01); *G02B 1/10* (2013.01); *G02B 26/101* (2013.01); *G03B 21/62* (2013.01);
(Continued)

(58) Field of Classification Search
CPC ........ G02B 1/10; G02B 26/10; G02B 26/101; G06F 1/16; G06F 1/1626; G06F 3/0481;
(Continued)

(56) References Cited

U.S. PATENT DOCUMENTS 5,175,772 A 12/1992 Kahn et al.
7,025,274 B2 4/2006 Solomon et al.
(Continued)

FOREIGN PATENT DOCUMENTS

DE 102009046325 A1 5/2010
EP 3108615 A1 12/2016
(Continued)

OTHER PUBLICATIONS

USPTO Notice of Allowance for U.S. Appl. No. 15/920,155 dated Dec. 20, 2018.
(Continued)

*Primary Examiner* — Jie Lei
(74) *Attorney, Agent, or Firm* — Lorenz & Kopf, LLP

(57) ABSTRACT

An addressable display system configured for use in a mounting adapter configured to mount a personal electronic device (PED) on an aircraft includes a transparent surface configured to overlay the display surface of a PED when the PED is mounted in the mounting adapter wherein the transparent surface includes a region that is uniformly coated with a coating layer that when activated with a select excitation wavelength is configured to emit visible light to annunciate a message indicating a problem with an image displayed on a PED display; a lighting source configured to provide light in at an excitation wavelength; a MEMS (microelectromechanical systems) scanner module that is controllable to write desired symbology for annunciation at different addressable locations on the transparent surface; and an imaging device configured to capture an image of the PED display for an integrity check of data displayed on the PED display.

20 Claims, 11 Drawing Sheets

(51) Int. Cl.
| | |
|---|---|
| *G06F 1/16* | (2006.01) |
| *G02B 1/10* | (2015.01) |
| *H04L 29/08* | (2006.01) |
| *G02B 26/10* | (2006.01) |
| *G03B 21/62* | (2014.01) |
| *G06F 3/03* | (2006.01) |
| *B64D 45/00* | (2006.01) |

(52) U.S. Cl.
CPC .......... *G06F 1/1607* (2013.01); *G06F 1/1626* (2013.01); *G06F 1/1632* (2013.01); *G06F 1/1639* (2013.01); *G06F 1/1656* (2013.01); *G06F 3/0304* (2013.01); *H04B 7/18506* (2013.01); *H04L 67/12* (2013.01); *B64D 2045/0075* (2013.01); *B81B 2201/042* (2013.01); *G06F 2200/1633* (2013.01)

(58) Field of Classification Search
CPC .... G06F 3/04817; G06F 11/0739; G06F 3/14; G06F 21/31; G06F 1/1607; G06F 1/1632; G06F 1/1639; G06F 3/0304; G06F 2200/1633; G06F 1/1656; H04B 7/185; H04B 7/18506; B81B 3/00; B81B 3/0083; B81B 2201/142; B81B 2201/042; H04L 29/08; H04L 67/12; H04L 67/02; G03B 21/62; B64D 2045/0075
USPC ............... 359/292, 461, 452, 874, 876, 904; 353/22, 98, 122; 345/1.2, 2.2, 14, 84, 345/110
See application file for complete search history.

(56) References Cited

U.S. PATENT DOCUMENTS

| | | |
|---|---|---|
| 7,139,644 B2 | 11/2006 | Bernard et al. |
| 7,239,080 B2 | 7/2007 | Ng et al. |
| 8,803,772 B2 | 8/2014 | Kent et al. |
| 9,141,830 B2 | 9/2015 | Uczekaj et al. |
| 9,158,115 B1 | 10/2015 | Worley et al. |
| 9,337,953 B1 | 5/2016 | Raghu et al. |
| 9,341,843 B2 | 5/2016 | Border et al. |
| 9,583,008 B2 | 2/2017 | Marion et al. |
| 9,714,081 B1 | 7/2017 | Hall, III et al. |
| 2002/0039070 A1 | 4/2002 | Ververs |
| 2004/0155186 A1 | 8/2004 | Nestorovic et al. |
| 2005/0174635 A1* | 8/2005 | Bruegl ................ G02B 27/01 359/443 |
| 2005/0231692 A1 | 10/2005 | Sun et al. |
| 2006/0221022 A1 | 10/2006 | Hajjar |
| 2007/0281734 A1 | 12/2007 | Mizrachi |
| 2009/0058682 A1 | 3/2009 | True |
| 2010/0110657 A1 | 5/2010 | Weindorf |
| 2010/0214130 A1 | 8/2010 | Weinmann et al. |
| 2010/0328420 A1 | 12/2010 | Roman |
| 2011/0063452 A1 | 3/2011 | Fifis et al. |
| 2011/0101058 A1 | 5/2011 | Heckman |
| 2012/0050487 A1 | 3/2012 | Masumura et al. |
| 2012/0140125 A1 | 6/2012 | Pepitone et al. |
| 2013/0083049 A1 | 4/2013 | Mizuno |
| 2013/0220841 A1 | 8/2013 | Yang |
| 2013/0305391 A1 | 11/2013 | Haukom et al. |
| 2013/0334545 A1 | 12/2013 | Hu et al. |
| 2014/0262847 A1 | 9/2014 | Yang |
| 2014/0264196 A1 | 9/2014 | Werner et al. |
| 2015/0029140 A1 | 1/2015 | Hwang et al. |
| 2015/0241765 A1 | 8/2015 | Hajjar et al. |
| 2015/0277219 A1 | 10/2015 | Gwin et al. |
| 2015/0295897 A1 | 10/2015 | Chang et al. |
| 2015/0381929 A1 | 12/2015 | Lee |
| 2016/0122036 A1 | 5/2016 | Hathaway |
| 2016/0349933 A1 | 12/2016 | Owczarski et al. |
| 2017/0078834 A1 | 3/2017 | Anderson et al. |
| 2017/0195647 A1 | 7/2017 | Honkanen et al. |
| 2017/0251501 A1 | 8/2017 | Batsakes et al. |
| 2018/0260346 A1 | 9/2018 | Oh |
| 2019/0075290 A1 | 3/2019 | Dubey et al. |

FOREIGN PATENT DOCUMENTS

| | | |
|---|---|---|
| EP | 3210891 A1 | 8/2017 |
| FR | 2818777 A1 | 6/2002 |
| WO | 2010045411 A1 | 4/2010 |
| WO | 2015127203 A1 | 8/2015 |

OTHER PUBLICATIONS

Miller, B., et al; Policy and Guidance for Electronic Flight Bag Class 1 & 2 System Architecture and Aircraft Connectivity; Federal Aviation Administration, Jan. 2018.

* cited by examiner

ADDRESSABLE DISPLAY SYSTEM FOR ICA MONITORING AND ANNUNCIATION FOR CERTIFIED APPLICATIONS RUNNING ON A PERSONAL ELECTRONIC DEVICE

CROSS-REFERENCE TO RELATED APPLICATION

This application claims priority to U.S. Provisional Application No. 62/595,623 filed Dec. 7, 2017. This application incorporates the provisional application into the present application by reference.

TECHNICAL FIELD

The present disclosure generally relates to display systems, and more particularly relates to display systems for displaying critical information on uncertified displays.

BACKGROUND

In many safety critical and/or regulated industries, such as avionics, maritime, rail, medical devices, nuclear, and others, display systems that display mission critical information may need to be certified that they can provide adequate integrity, continuity, and availability (ICA) for the mission critical information to be displayed thereon. The certification process may be costly and time-consuming and, therefore, may deter the implementation of new applications, such as new applications that use personal electronic devices (PEDs) to display mission critical information.

In the avionics industry, low-cost PEDs, such as tablet computers and smartphones, are being used for non-critical applications, such as charts and maps applications and weight and balance calculators. Operators may also want to have the freedom to display aeronautical information, such as airport moving maps, air traffic (Cockpit Display of Traffic Information or CDTI), advanced weather radar information, and others, on tablet computers instead of having to make costly modifications and upgrades to their existing avionics displays. Long-standing regulatory policy prohibits the display of critical aeronautical information during flight on uncertified displays because adequate integrity, continuity, and availability (ICA) cannot be assured.

Accordingly, it is desirable to provide a certifiable system for displaying critical information on uncertified displays or displays not approved for the display of data requiring high ICA. Furthermore, other desirable features and characteristics will become apparent from the subsequent detailed description, taken in conjunction with the accompanying drawings and the foregoing technical field and background.

SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter Systems and method are provided for allowing the use of uncertified displays to display mission critical information. In one embodiment, an addressable display system configured for use in a mounting adapter configured to mount a personal electronic device (PED) on an aircraft is disclosed. The display system includes a transparent surface configured to overlay the display surface of a PED when the PED is mounted in the mounting adapter. The transparent surface includes a region that occupies a substantial portion of the transparent surface that is uniformly coated with one or more coating layers that when activated with a select excitation wavelength are configured to emit visible light to annunciate a message. The display system further includes a lighting source mounted on the mounting adapter and configured to provide light in the excitation wavelength when activated to illuminate the transparent surface; a MEMS (microelectromechanical systems) module mounted on the mounting adapter, trained on the display screen, and controllable to write desired symbology for annunciation using the select excitation wavelength on the one or more coating layers at different addressable locations on the transparent surface; and an imaging device mounted in the mounting adapter and configured to capture an image of the PED display for transmission to a server that transmitted data for display on the PED display for performing an integrity check of the displayed data and for activating the lighting source when a problem is detected with the image of the PED display.

In another embodiment, a method of providing an addressable display system in a mounting adapter configured to mount a personal electronic device (PED) on an aircraft is disclosed. The method includes overlaying the display surface of a PED display with a transparent surface when the PED is mounted in the mounting adapter wherein the transparent surface includes a region that occupies a substantial portion of the transparent surface that is uniformly coated with one or more coating layers that when activated with a select excitation wavelength are configured to emit visible light to annunciate a message. The method further includes capturing, using a camera mounted in the mounting adapter, an image of the PED display for transmission to a server that transmitted data for display on the PED display for performing an integrity check of the displayed data and for causing the annunciation of a message when a problem is detected with the image of the PED display; receiving a message from the server to annunciate a message indicating a problem with the image displayed on the PED display; activating a lighting source housed in the mounting adapter to provide light in a select excitation wavelength responsive to receipt of the message; directing the light at the select excitation wavelength to select locations on the transparent surface using a dual-axis scanned MEMS micro-mirror attached to the mounting adaptor to annunciate the message; activating the one or more coating layers at the select locations with the light at the select excitation wavelength to emit visible light at the select locations; and displaying the message indicating a problem with the image displayed on the PED display.

In another embodiment, an addressable display system configured for use on an aircraft is disclosed. The display system includes a surface configured to overlay a display in the aircraft. The surface includes a region that occupies a substantial portion of the surface that is uniformly coated with one or more coating layers that when activated with a select excitation wavelength are configured to emit visible light to annunciate a message. The display system further includes a lighting source configured to provide light in the excitation wavelength when activated to illuminate the surface; a MEMS (microelectromechanical systems) micro-mirror that is controllable to scan the excitation wavelength in the x-y directions to write different annunciation symbology using the select excitation wavelength on the one or more coating layers at different addressable locations on the surface; a MEMS controller that is configured to control the movement of the MEMS micro-mirror in the x-y directions to allow different annunciation symbols to be written onto the surface at different addressable locations and including a geometric compensation module that is configured to perform geometric compensation of the MEMS micro-mirror scan angles to direct a geometric compensated excitation waveform image onto the surface; and an imaging device configured to capture an image of the display for transmission to a server configured to analyze the image and configured to activate the lighting source when predetermined conditions are detected.

Furthermore, other desirable features and characteristics will become apparent from the subsequent detailed description and the appended claims, taken in conjunction with the accompanying drawings and the preceding background.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
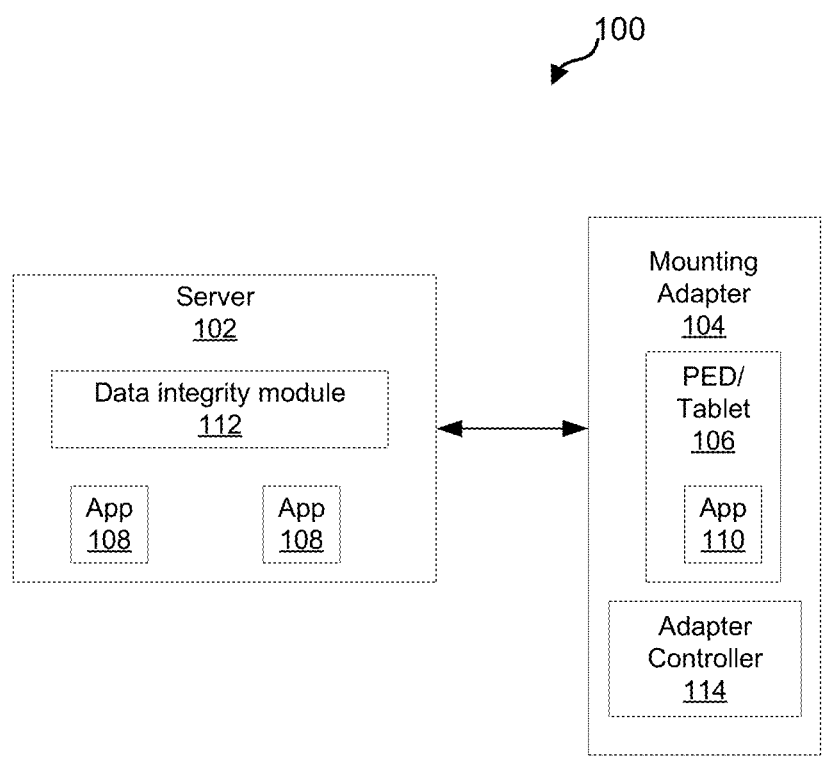
FIG. 1 is a block diagram depicting an example display system in an aircraft that allows uncertified display systems such as commercial PEDs/tablet computers to meet typical avionics requirements for the monitoring of ICA, in accordance with various embodiments.

The following detailed description is merely exemplary in nature and is not intended to limit the application and uses. References to aeronautical and/or aviation specific terms such as but not limited to "cockpit", "flight deck", "certification", or "aircraft" are for simplifying the description and are not intended to limit the application and uses to the aviation or aeronautical industry. Furthermore, there is no intention to be bound by any expressed or implied theory presented in the preceding technical field, background, summary, or the following detailed description. As used herein, the term "module" refers to any hardware, software, firmware, electronic control component, processing logic, and/or processor device, individually or in any combination, including without limitation: application specific integrated circuit (ASIC), a field-programmable gate-array (FPGA), an electronic circuit, a processor (shared, dedicated, or group) and memory that executes one or more software or firmware programs, a combinational logic circuit, and/or other suitable components that provide the described functionality.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with any number of systems, and that the systems described herein are merely exemplary embodiments of the present disclosure.

For the sake of brevity, conventional techniques related to signal processing, data transmission, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

Apparatus, systems, methods, techniques and articles are described for providing assurance that an uncertified display, such as a display on a personal electronic device (PED) (e.g., a tablet computer, a smartphone, or some other device), that is used to display mission critical data (e.g., critical aeronautical information) accurately conveys the mission critical data. The apparatus, systems, methods, techniques and articles described herein may provide assurances that an uncertified display accurately conveys mission critical data by verifying the integrity, continuity, and availability (ICA) of the mission critical data displayed on the uncertified display. Loss of accuracy or ICA can be annunciated to operators (e.g., a flight crew) of the uncertified display without reliance on the uncertified display to self-report the loss when displaying the mission critical data.

In the case of aeronautical applications, the apparatus, systems, methods, techniques and articles described herein may allow operators to use a PED to display aeronautical information. This may allow for a more affordable and quicker adoption of new avionics functionality. The described apparatus, systems, methods, techniques and articles may allow for mission critical data such as that generated by multiple high integrity applications (e.g. airborne situational awareness (AIRB) and various other CNS-ATM (Communications Navigation and Surveillance-Air Traffic Management) applications such as flight deck interval management (FIM) or air traffic control controller/pilot data link communication (CPDLC), SURF (Surface Surveillance application that includes an airport moving map with traffic superimposed), and others) to be displayed on uncertified displays. At the same time, the described apparatus, systems, methods, techniques and articles can allow data from lower integrity applications, such as maps and charts, to be displayed on the uncertified displays without changes to the applications or equipment installation.

A technical benefit of this approach is the ability to add high integrity applications to an aircraft that is already using low integrity devices (off-the-shelf tablets or other personal electronic devices) or would like to add these applications without the added cost of installing a class 3 EFB or impacting the existing high integrity display and control systems.

FIG. 1 is a block diagram depicting an example system 100 that allows an uncertified display system, such as a PED, to meet typical avionics requirements for the monitoring of ICA. The example system 100 includes an application server 102 and a mounting adapter 104 configured to mount a PED 106 (having a PED display) in an aircraft flight deck or cockpit.

The example application server 102 includes at least one processor and a computer-readable storage device or media encoded with programming instructions for configuring the at least one processor. The example application server 102 is positioned in an aircraft. The example application server 102 is a fully certified avionics box that hosts and executes one or more high integrity avionics application modules 108. The high integrity avionics application modules 108 are configured to generate mission critical data (e.g., critical aeronautical information) for display on a cockpit display. The example application server 102 is configured to transmit the generated critical aeronautical information to an uncertified cockpit display (e.g., the PED 106) for display (e.g., on the PED display).

The example application server 102 also includes a data integrity module 112 that is configured to monitor the image displayed on an uncertified cockpit display when critical aeronautical information is transmitted from a high integrity avionics application module 108 to the uncertified cockpit display device (e.g., PED 106) to determine whether a problem exists with the display of the mission critical data on the uncertified display device. The example data integrity module 112 is configured to determine whether a problem exists with the display of the mission critical data on the uncertified display device 106 by verifying the integrity, continuity, and availability (ICA) of the mission critical data displayed on the uncertified display device 106. The example data integrity module 112 is also configured to cause the annunciation of a message indicating that a problem exists with the display of mission critical data on the uncertified display device 106, when it determines that a problem indeed exists.

The mounting adapter 104 is configured to mount an uncertified display device 106 in an aircraft cockpit for use by a flight crew so that the uncertified display device 106 may display critical or non-critical aeronautical information to the flight crew. When the uncertified display device 106 comprises a tablet computer, the mounting adapter 104 may include a clamshell shape to fully enclose the tablet computer 106.

The example uncertified display device 106 may comprise a PED (such as a tablet computer, a smartphone, or some other device), which includes at least one processor and computer readable media, and is configured to host and execute one or more application programs such as a specialized avionics display application 110. The example specialized avionics display application 110 is configured to display critical aeronautical information received by the PED 106 from the application server 102.

The example mounting adapter 104 further includes an adapter controller 114. The example controller 114 includes at least one processor and computer readable media. In other embodiments, the adapter controller 114 may not include a processor. The example controller 114 is configured (for example by programming instructions) to transmit images of the display on the uncertified display device 106 to the data integrity module 112 and to activate the annunciation of a message indicating that a problem exists with the display of mission critical data on the uncertified display device 106, when the data integrity module 112 determines that a problem exists.

Figure 2:
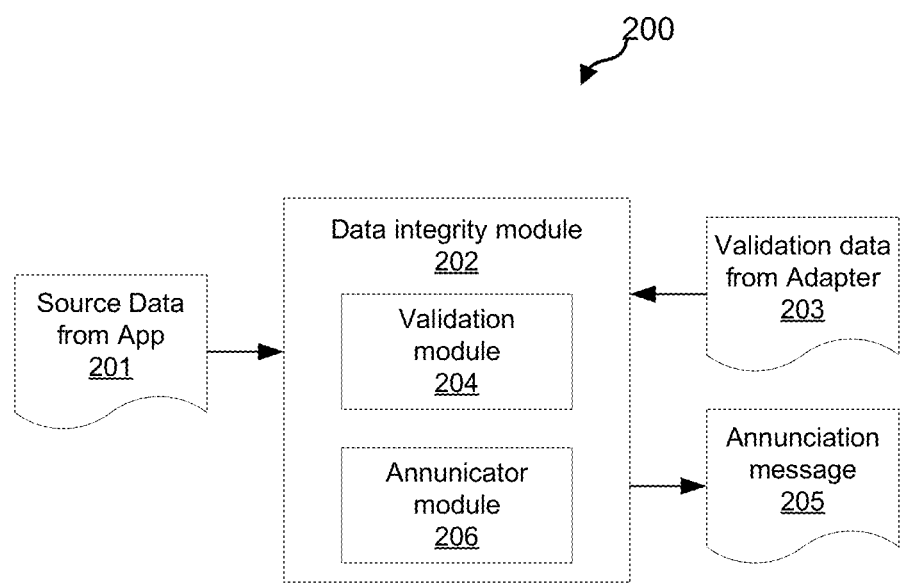
FIG. 2 is a block diagram depicting an example data integrity module in a server in an aircraft that allows the display of critical aeronautical information on an aircraft display that is not certified for displaying critical aeronautical information, in accordance with various embodiments.

FIG. 2 is a block diagram depicting an example data integrity module 202 in a server 200 wherein the example data integrity module provides a way to display critical aeronautical information on an aircraft display that is not certified for displaying critical aeronautical information. The example data integrity module includes a validation module 204 and an annunciator module 206. All or parts of the example data integrity module may be incorporated in an application module (e.g., application module 108 from FIG. 1) or separate from the application module.

The validation module 204 is configured to compare source data 201 (e.g., critical aeronautical information) received by the data integrity module 202 from a high integrity avionics application (e.g., high integrity avionics application module 108 from FIG. 1) to validation data 203 (which includes PED image information) received by the data integrity module 202 from a monitoring adapter (e.g., mounting adapter 104 from FIG. 1). The validation module 204 is configured to compare the source data 201 to the validation data 203 to determine whether a problem exists with the display of mission critical data on the uncertified display device (e.g., PED 106 from FIG. 1). The example validation module 204 is configured to determine whether a problem exists with the display of mission critical data on the uncertified display device (e.g., PED 106) by verifying the ICA of the mission critical data displayed on the uncertified display device (e.g., PED 106).

The annunciator module 206 is configured to communicate an annunciation message 205 (e.g. a loss of ICA) to the mounting adapter (e.g., mounting adapter 104 from FIG. 1) that instructs the mounting adapter to annunciate a message that indicating that a problem exists with the display of mission critical data on the uncertified display device, when the validation module 204 determines that a problem does exist with the display of the mission critical data.

Figure 3:
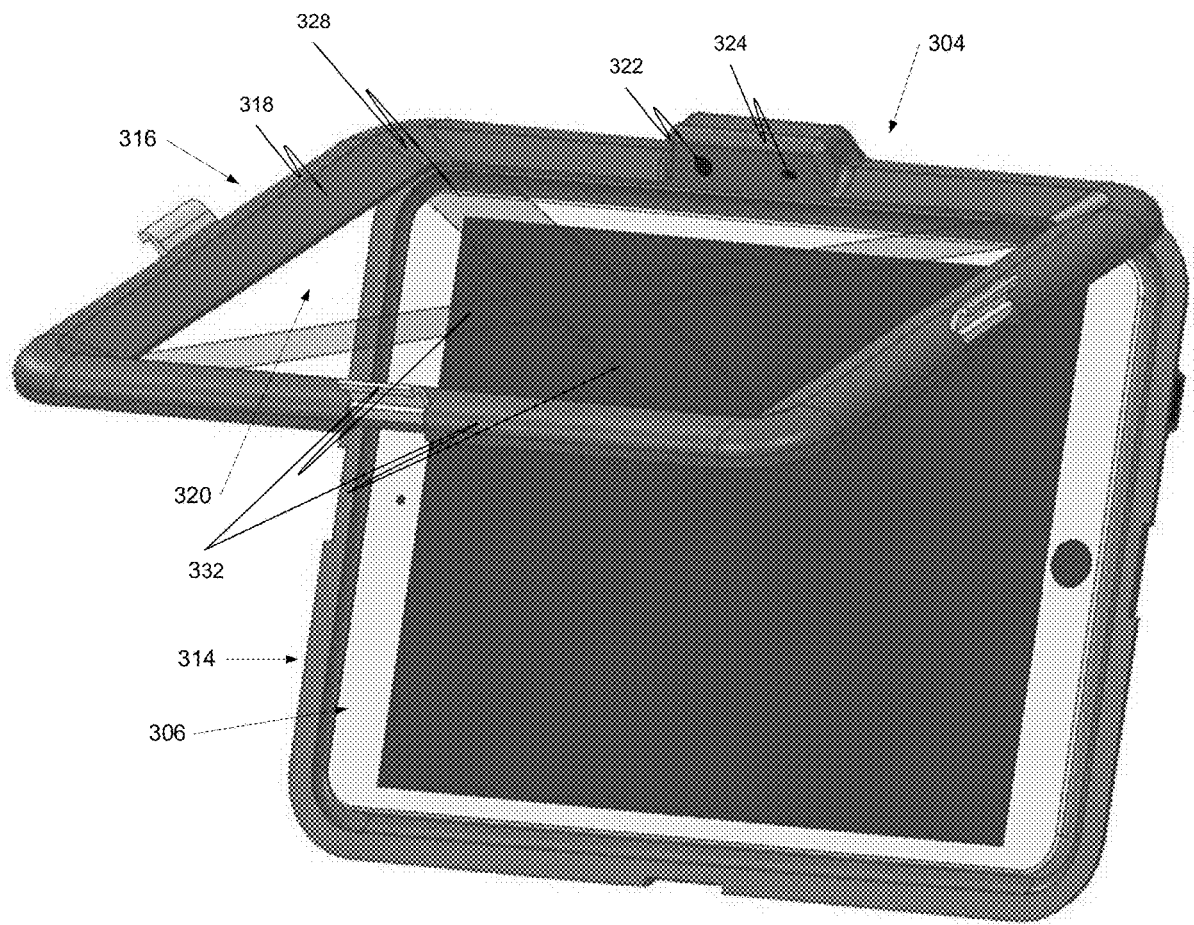
FIG. 3 is a block diagram illustrating an example PED mounting device, in accordance with various embodiments.

FIG. 3 is a diagram depicting a simplified perspective view of an example mounting adapter 304. The example mounting adapter 304 incorporates a clamshell design configured to mechanically capture a PED/tablet 306 and mount the mounting adapter 304 and PED 306 combination (i.e., the display assembly) in the aircraft flight deck or cockpit.

The example mounting adapter 304 includes a base or back 314 and a lid, cover, or front 316. The example base or back 314 is configured to be slightly larger than the outline of the tablet 306 to be mounted and may have threaded mounting bosses on the back to facilitate installation of the mounting adapter 304 in the aircraft. The example base 314 may also host multiple electrical wiring necessary to provide power and data exchange with the server 302.

The example mounting adapter 304 is also configured with a lid 316 that may be closed over the top of the tablet 306 to fully enclose the tablet 306 within the mounting adapter 304. The example lid 316 includes a bezel 318, a surface 320 (e.g., an optically and capacitively transparent film), an optical imaging device 322 (e.g., a camera), and an actuation source 324 (e.g., optically emissive devices).

The example bezel 318 is attached to the base 314 by hinges (not shown) or other mechanical means and closes around the tablet 306 to mechanically capture the tablet 306. The example bezel 318 also hosts the optically and capacitively transparent film 320, the optical imaging device 322, and the optically emissive devices 324.

The example surface 320 is attached to the bezel 318 in a way that provides it physical contact with the tablet display when the lid 316 is closed to allow for normal touch-gesture control and display action of the tablet 306. Further, the example surface 320 has special properties such as an actuatable covering 328 (e.g., a special coating) with applied or embedded nanoparticles which are optically active in the presence of an excitation source such as electrical voltage or current or coincident optical or near-optical radiation (such as ultraviolet light). Upon application of the appropriate excitation signal, the covering 328 changes state from normally optically transparent to optically emissive or opaque in a way that is easily visible to an operator in multiple lighting conditions encountered on a flight deck.

An imaging device 322, such as a small camera (e.g., a camera similar to one that might be included in a smart phone), can be mounted or embedded on/in the bezel 318 of the lid 316 and aimed in a manner to provide for maximum view of the tablet display. More than one imaging device 322 may be used or a corrective lens (not shown) may be applied to compensate for the extremely oblique viewing angle the imaging device 322 may have with the tablet's display. The viewing angle of the imaging device(s) 322 may be enhanced or augmented by the use of lenses to optimize the image quality.

An actuation source 324, such as optically emissive devices (e.g., LEDs (light-emitting diodes) operating in a predominantly non-visible light band) may be located on the bezel and trained on the cover film 320 to illuminate the film's coating and activate its optical qualities. The LEDs, in some embodiments, may produce light in the UV-A band (e.g., 320-425 nm) and, in some embodiments, may produce light at 385 nm for the color red. Other optically reactive technology, such as MEMS (Microelectromechanical systems) scanners and laser diodes, may alternatively be located on the bezel and trained on the cover film 320 to illuminate the film's coating and activate its optical qualities. Alternatively, if the actuatable covering 328 can be activated by an electrical signal, then the optically emissive devices 324, MEMS scanners, and laser diodes would not be needed in the bezel.

The example mounting adapter 304 further includes an adapter controller (not shown). The adapter controller is configured to transmit images from the display on the PED 306 to an application server (e.g., server 102 from FIG. 1), receive messages from the server indicating that a problem exists with the display of mission critical data on the tablet display (e.g. a loss of ICA), and cause the actuation source 324 to actuate the covering 328 to annunciate a message indicating that a problem exists with the display of mission critical data on the tablet display, when the server determines that a problem exists with the display of the mission critical data.

Figure 4:
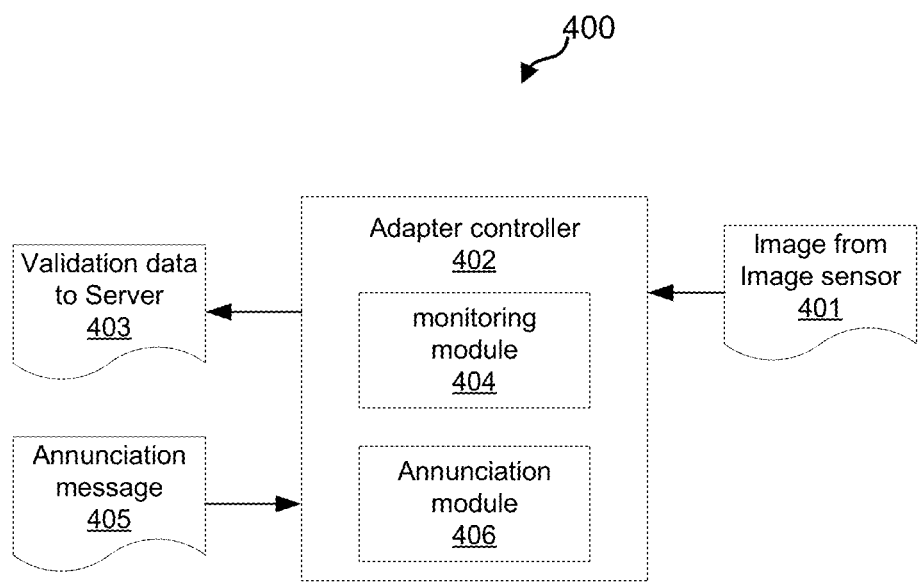
FIG. 4 is a block diagram depicting an example adapter controller in an adapter for allowing the display of critical aeronautical information on an aircraft display that is not certified for displaying critical aeronautical information, in accordance with various embodiments.

FIG. 4 is a block diagram depicting an example adapter controller 402 in a mounting adapter 400. The example adapter controller includes a monitoring module 404 and an annunciation module 406. The example adapter controller 402 includes at least one processor and a computer-readable storage device or media encoded with programming instructions for configuring the controller. The processor may be any custom-made or commercially available processor, a central processing unit (CPU), a graphics processing unit (GPU), an application specific integrated circuit (ASIC), a field programmable gate array (FPGA), an auxiliary processor among several processors associated with the controller, a semiconductor-based microprocessor (in the form of a microchip or chip set), any combination thereof, or generally any device for executing instructions. The computer readable storage device or media may include volatile and nonvolatile storage in read-only memory (ROM), random-access memory (RAM), and keep-alive memory (KAM), for example. KAM is a persistent or non-volatile memory that may be used to store various operating variables while the processor is powered down. The computer-readable storage device or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable programming instructions, used by the controller. In other embodiments, the adapter controller 402 may not include a processor.

The example monitoring module 404 is configured to retrieve an image 401 of the PED display from an imaging sensor (e.g., imaging sensor from imaging device 322 from FIG. 3) and transmit validation data 403 (which includes image information from the PED display) to an application server (e.g., server 102 from FIG. 1). The example annunciation module 406 is configured to receive an annunciation message 405 from the server indicating that a problem exists with the display of mission critical data on the PED display (e.g. a loss of ICA), and cause an actuation source (e.g., actuation source 324 from FIG. 3) to actuate the covering 328 to annunciate a message indicating that a problem exists with the display of mission critical data on the PED display, when the server determines that a problem exists with the display of the mission critical data.

Referring again to FIGS. 1 and 3, the example system 100 may function as follows. An avionics application 108 such as a CDTI may execute on the server 102 while an avionics display application 110 executes on the tablet 106 or 306. The tablet 106 or 306 is enclosed in the mounting adapter 104 or 304 which is mounted on the flight deck in a suitable location (e.g., on the outboard side of the crew's seats). The mounting adapter 104 or 304 may be connected to the server 102 by several bus wires, such as a bi-directional data bus which allows for information exchanges between the tablet 106 or 306 and the server 102 (and perhaps supplies power to the tablet), a bus to carry video information from the imaging device 322 to the server 102, and a signal or power bus from the server 102 to the actuation source 324. Alternatively, the mounting adapter 104 or 304 may be wirelessly connected to the server 102. The mounting adapter 104 or 304 may be additionally differentiated from commercially available tablet cases in that it may be qualified for aviation use by providing mechanical and electrical protection for the tablet 106 or 306 and the aircraft by being qualified according to RTCA DO-160(x).

The example system 100 can allow uncertified display devices such as PEDs/tablets 106 or 306 to display critical aeronautical information by performing two functions: ICA monitoring and providing crew annunciation of non-nominal ICA status.

ICA monitoring may be accomplished in two layers as follows. The avionics application 108 executing on the server will determine what information/images need to be displayed on the tablet 106 and will encode (e.g., using HTML5) and transmit that information to the avionics display application 110 executing on the tablet 106 or 306. In the first layer, prior to displaying any of this information, the avionics display application 110 will decode the information to be displayed and re-encode it in a dis-similar protocol and "echo back" the information to the server 102, which will compare the echo-back information with the information originally sent. Matching information will result in an "ack" (acknowledgement) from the server to the tablet while a mismatch would generate a "no-ack" and a crew annunciation. This first layer provides for monitoring the ICA to the avionics display application 110 but does not provide for monitoring the link between the avionics display application 110 and the physical display.

In the second layer, the system may monitor the actual information displayed on the screen via the image sensor 322 mounted on the bezel 318. As an example, monitoring may include monitoring all aspects of the display (color and location of every pixel) or using a sampling scheme where the probability of detecting loss of ICA is equivalent or better to the requirements of the Hazard Classification of the application. Thus, the monitoring rigor can be tailored to the criticality of the application. Sampling schemes could be further simplified by using specific patterns like QR codes which are displayed for a few milliseconds (faster than the time it takes for the human eye to perceive) on the display and may be customized for optimal recognizability by the image sensor 322 (e.g., a keystone, hyperbolic, or other optimal shape). The codes could be randomly changed in content, location, and timing to add robustness to the sampling scheme. In any case, the optical information imaged by the image sensor 322 is sent back to the server 102 to enable the software application 108 to compare the image detected to what it expected to see based on what it sent to the PED 106 or 306 for display. If a loss of ICA is detected, the server 102/application 108 would activate the appropriate annunciation.

If the server 102/application 108 determines that there has been a loss of ICA, it can activate an annunciation by asserting the appropriate electrical signal on the output bus to activate the coating on the cover film 320 of the tablet mounting adapter 104. As an example, the annunciation might simply put a red 'X' 332 over the display if a failure was detected. An 'X' character could be coated onto the cover film 320. Other more sophisticated (but fixed) imagery or text could (also or alternatively) be coated onto the cover film including one or more textual failure messages. In addition, a fail-condition may also result in the sending of display information to an alternate location such as a different tablet.

Annunciation may be accomplished as follows. The film 320 and coating 328 provides the overall system with the ability to annunciate fixed or variable information to the crew as encoded in the coating 328 or other optically reactive elements. Signal inputs from the server 102 may be used to activate the optical coating 328. The activation may be electrical, similar to the way an LCD is activated, by the application of a voltage across the breadth of the coating.

The activation may also be accomplished by illuminating the coating with a selective bandwidth of emitted light. In this example, light emitting elements such as discrete LEDs may be designed into the bezel of the lid and aimed toward the coating on the film. The LEDs would be energized by a signal or signals from the server and would then illuminate the coating in a flood pattern. The coating would be activated by the illumination provided by the LEDs and would change state to be clearly visible to the crew. The spectrum of light required to activate the coating would be selected to use light not typically found on flight decks either from natural or artificial light to avoid un-commanded activation of the coating.

An alternate implementation may use illumination devices such as laser diodes wherein the laser light is directed to specifically intended locations by means of providing coordinates from the server to a MEMS Scanner which would direct the excitation light to those intended locations on the cover film. This technique may employ a stroke or raster scan pattern which allows characters or images to be displayed on the cover film.

Figure 5:
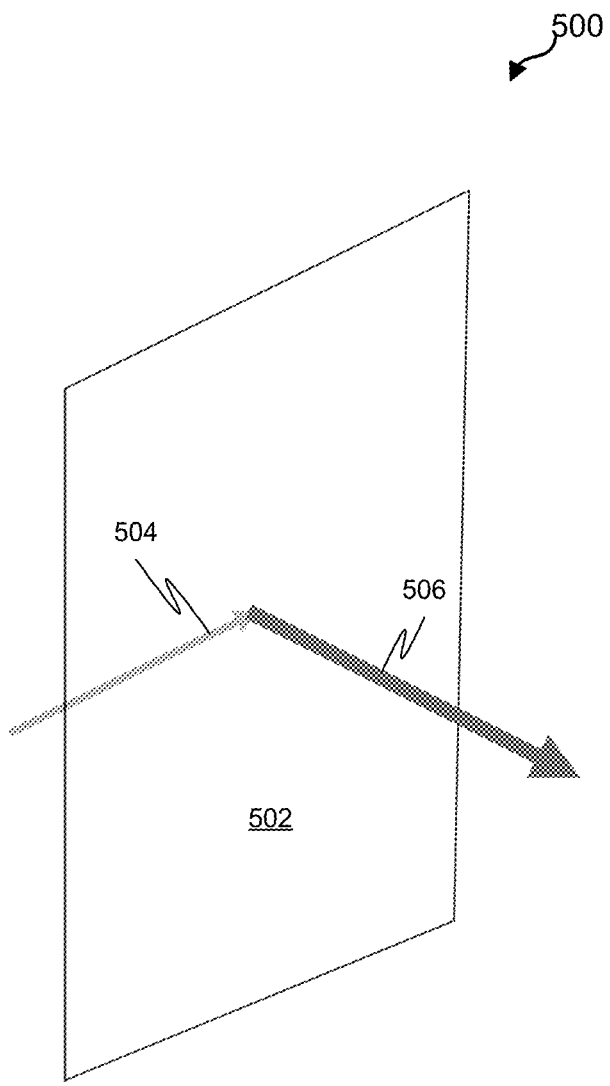
FIG. 5 is a diagram depicting a partial perspective view of an example display integrity system configured for use in a mounting adapter, in accordance with various embodiments.

FIG. 5 is a diagram depicting a perspective view of an example display integrity system 500 configured for use in a mounting adapter, such as the example mounting adapter 304, to facilitate monitoring a PED display that displays mission critical information and annunciating a message indicating a problem with the display when a problem is detected. The example display integrity system 500 includes a transparent surface (or screen) 502 that is configured to overlay the display surface of a PED when the PED is mounted in the mounting adapter. The example transparent surface 502 can be laminated onto the display surface of the PED display directly, or may be fixed in the mounting adaptor in a manner that allows the transparent surface 502 to overlay the display surface of the PED display when the PED is mounted in the mounting adapter. For example, when the mounting adapter is in a clamshell configuration and when the clamshell is closed with the PED mounted inside, the example transparent surface 502, which can be made part of the top cover of the clamshell structure, can be positioned in intimate contact with the PED display surface.

The example transparent surface 502 is configured with high transmittance (e.g., at a minimum >60%, but typically >75%) in the visible wavelength range (when inactive). The example transparent surface 502 is configured with a transmittance that is sufficient to allow the PED display to be visible in lighting conditions on a flight deck.

The example transparent surface 502 is configured to allow touchscreen gestures on the PED display. The example transparent surface 502 is configured to not interfere with the capacitive (PCAP) touch screen operation of the PED. The example transparent surface 502 is also configured to support gloved touch interaction with the PED.

The example transparent surface 502 includes one or more regions embedded with one or more coating layers of fluorescent phosphor nanoparticles that when activated with a select excitation wavelength are configured to emit visible light. The example transparent surface 502 can be configured via the arrangement of regions and coating layers of fluorescent phosphor nanoparticles to emit light in one or more colors. As an example, a single region and layer of fluorescent phosphor nanoparticles on the example transparent surface 502 may allow the example transparent surface, when active (e.g., "on"), to provide a monochrome display (e.g., a red or blue display). In another example, a single region with multiple coating layers may allow the example transparent surface, when active, to provide a display in multiple colors (e.g., red and blue or red, green and blue). The use of multiple coating layers may allow the example transparent surface 502 to provide a display in secondary display colors such as cyan and yellow. The example transparent surface 502, when inactive, is configured to not degrade the image quality (e.g., color, resolution, clarity and other readability attributes) of the PED display.

In the illustrated example, the example transparent surface 502 is embedded with fluorescent red emitting phosphor nanoparticles. When a select excitation wavelength 504, for example in the UVA band (e.g., 405 nm), from a lighting source housed in the mounting adapter is directed at the example transparent surface 502, the fluorescent red emitting phosphor nanoparticles may become active and can cause emissions 506 in the red region of the spectrum (centered, for example, around 605 nm) at the corresponding region of the transparent surface 502 embedded with fluorescent red emitting phosphor nanoparticles. The emissions 506 from the example fluorescent nanoparticles are Lambertian, which can provide an excellent viewing angle, and can provide a very fast turn-on time (e.g., <0.1 msec) providing excellent image quality similar to an OLED display.

The example transparent surface 502 is a passive screen, because it does not have electrical contacts (and does not require the application of an electrical signal). The display functionality is enabled by optically exciting, regions of the transparent surface 502 embedded with fluorescent phosphor nanoparticles with a select excitation wavelength, to emit visible light with a select spectrum (e.g., red or blue light spectrum) from the corresponding regions of excitation. The embedded fluorescent nanoparticles are tuned for the desired visible emission wavelengths (e.g., red, green or blue) using selected excitation wavelengths in the UVA spectral band. For example, an excitation wavelength of 405 nm (in the UVA band), from an LED or similar source may be selected to emit red color or blue color light depending on the type of fluorescent nanoparticles embedded on the surface of the transparent surface 502. The transparent surface 502 can be printed (or coated by standard coating techniques) with fluorescent nanoparticle phosphor layer across the whole (or substantial portion of the whole) surface of the transparent surface 502.

Figure 6A:
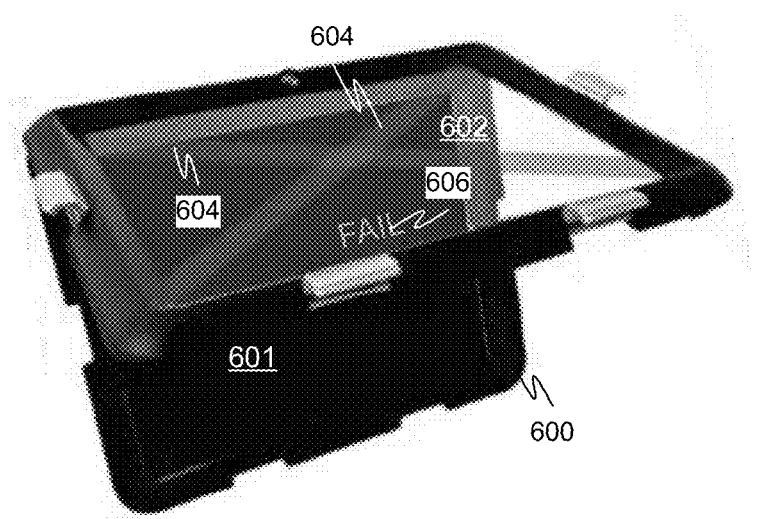
FIG. 6A is a diagram depicting a perspective view of an example mounting adapter that includes an example transparent surface that is configured to annunciate a message indicating a problem with an image displayed on a PED housed in the mounting adapter, in accordance with various embodiments.
Figure 6B:
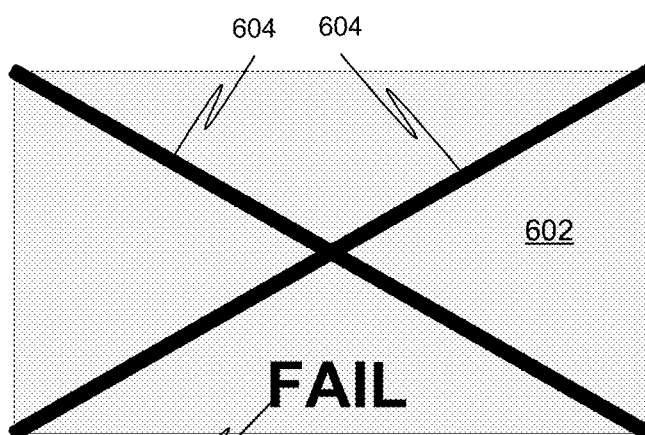
FIG. 6B is a diagram depicting a plan view of the example transparent surface, in accordance with various embodiments.
Figure 6C:
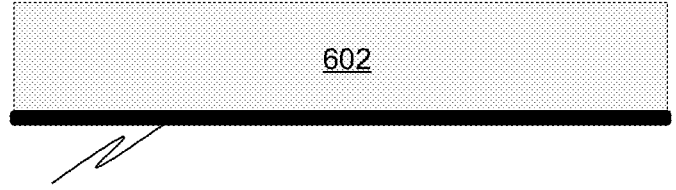
FIG. 6C is a diagram depicting a cross-sectional view of the example transparent surface, in accordance with various embodiments.

FIG. 6A is a diagram depicting a perspective view of an example mounting adapter 600 that includes an example transparent surface (or screen) 602 that is configured to annunciate a message indicating a problem with an image displayed on a PED 601 housed in the mounting adapter 600. FIG. 6B is a diagram depicting a plan view of the example transparent surface 602 and FIG. 6C is a diagram depicting a cross-sectional view of the example transparent surface 602. The example transparent surface 602 is configured, when active, to display static symbology, such as a red 'X' 604, to annunciate the loss of integrity and availability. The example transparent surface 602 is also configured, when active, to display fixed text 606 for annunciation. The symbology 604 and text 606 are made visible by emissions from fluorescent phosphor nanoparticles that are contained in coating layers on the transparent surface 602.

The example transparent surface 602 is a passive screen, because it does not have electrical contacts (and does not require the application of an electrical signal). The display functionality is enabled by optically exciting regions of the transparent surface 602 embedded with coating layers containing fluorescent phosphor nanoparticles with a select excitation wavelength, to emit visible light with a select spectrum (e.g., red or blue light spectrum) from the corresponding regions of excitation. The embedded fluorescent nanoparticles are tuned for the desired visible emission wavelengths (e.g., red, green or blue) using selected excitation wavelengths in a predominantly non-visible spectral band (e.g., 320-425 nm). For example, an excitation wavelength of 405 nm (in the UVA band), from an LED or similar source may be selected to emit red color or blue color light depending on the type of fluorescent nanoparticles embedded on the surface of the transparent screen 602.

Figure 7:
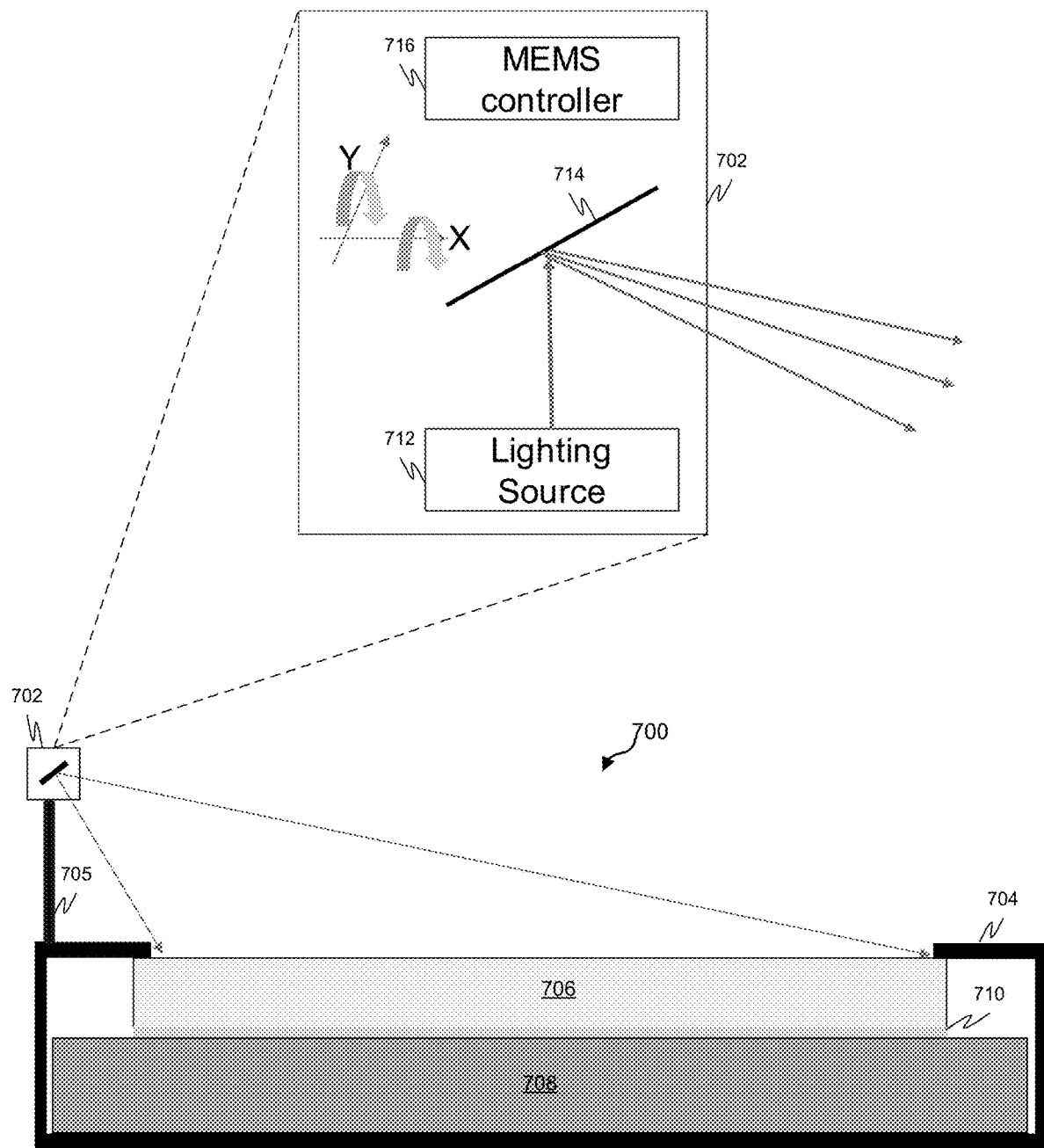
FIG. 7 is a block diagram depicting an example lighting system in an addressable display integrity system that is mounted on an example mounting adapter, in accordance with various embodiments.

FIG. 7 is a block diagram depicting an example lighting system 702 in an addressable display integrity system 700 that is mounted on an example mounting adapter 704 via a mount 705. The example addressable display integrity system 700 comprises the example lighting system 702, a transparent surface 706, and an imaging device (e.g., a camera) (not shown).

The example lighting system 702 is configured to direct light (e.g., predominantly non-visible light) in an excitation wavelength (e.g., 405 nm) to selective regions on the transparent surface 706 (e.g., glass or plastic substrate) that overlays a PED display 708 for a PED positioned in the mounting adapter 704. The example lighting system 702 is mounted on a side of the mounting adapter 704 in an unobtrusive way and is configured to not interfere with PED operations. An imaging device trained on the transparent surface 706 may be mounted next to the lighting system 702 to capture an image on the PED for comparison with an expected image for integrity check and annunciation.

The transparent surface 706 includes a coating 710 that when activated by a select wavelength emits light. The coating when activated can be used to annunciate failures in ICA of certified information displayed on the PED.

The example lighting system 702 comprises a dual-axis (e.g., X-Y) scanner module and includes a lighting source 712, such as an LED or laser diode, a dual-axis mirror 714, and a controller 716. The lighting source 712 is configured to emit an excitation beam of light (e.g., predominantly non-visible light) in the excitation wavelength (e.g., in the UVA band) when activated to illuminate the transparent screen 706 and its regions of patterned phosphor nanoparticle coating 710.

The dual-axis mirror 714 is controllable to direct the light to illuminate selective regions of the transparent screen 706 to write desired symbology for annunciation. The dual-axis mirror 714 is controllable to scan the excitation beam in the x-y directions to write desired symbology on the transparent surface 706.

The controller 716 is configured to control the movement of the dual-axis mirror 714 in two dimensions (e.g., X-Y) to allow for different annunciation symbology to be written onto the transparent screen 706. The light from the lighting source 712 activates the fluorescent phosphor nanoparticle coating 710 to emit visible light to provide the annunciation message. The wavelength(s) used by the lighting source 712 may be chosen to match the unique wavelengths needed to activate the fluorescent nanoparticle phosphor screens.

Figure 8A:
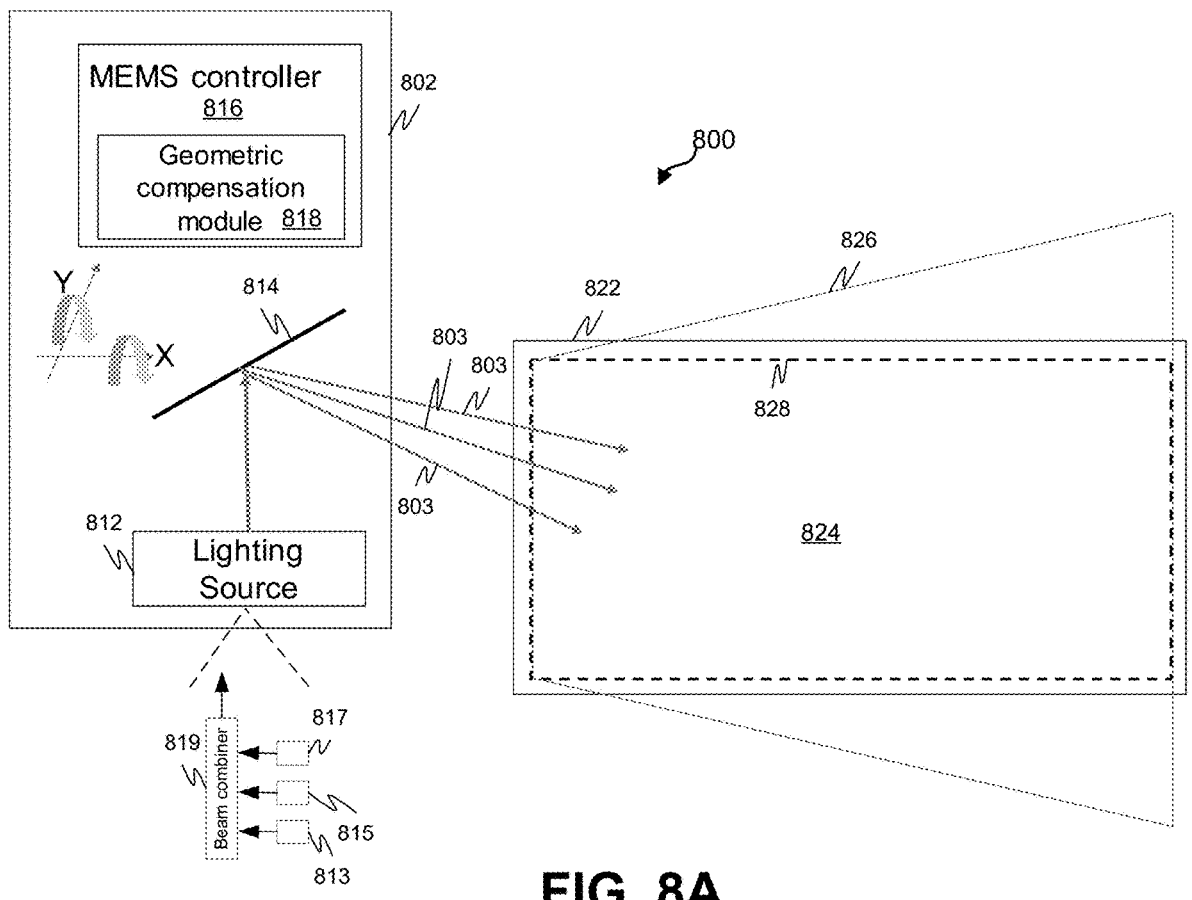
FIG. 8A is a block diagram depicting an example lighting system projecting light onto an example transparent surface in an example display integrity system, in accordance with various embodiments.

FIG. 8A is a block diagram depicting an example lighting system 802 projecting light 803 onto an example transparent surface 824 that overlays a PED display 822 in an example display integrity system 800. When annunciation is desired, the example lighting system 802 is configured to project light 803 in one or more select excitation wavelengths to specific addressable locations on the transparent surface 824. The example lighting system 802 is controllable to create multiple types of annunciation symbology at selectable locations at various resolutions on the transparent surface 824. The example lighting system 802 includes a lighting source 812, dual-axis mirror 814, and a controller 816.

Because the example lighting system 802 is offset from the transparent surface 822, the projected image from the excitation wavelengths may be geometrically distorted and the projected image may need to be geometrically compensated (e.g., keystone compensated) as illustrated in FIG. 8. Depicted are the outline 826 of the projected image prior to geometric compensation and the outline of the projected image after geometric compensation. The keystone effect (a type of geometric image distortion) may occur when a projection device projects an image onto an angled surface that is not perpendicular to the horizontal centerline of the surface. In such a situation, the image dimensions can become distorted. Geometric compensation (e.g., keystone compensation) provides the ability to skew (or intentionally distort) an output image an appropriate amount to recreate the original rectangular image and cause the displayed image to appear rectangular on the angled surface, thus eliminating the skewed output that would otherwise result due to angled projection. The example controller in the example lighting system is configured to perform geometric compensation on the light that is projected by the lighting system 802 onto the transparent surface 824 by adjusting the scan angles. The scan angle compensation may include reducing the scan angle as the scanned light is directed further away from the lighting source along the transparent surface 824.

The example lighting system 802 is also configured to provide the projected light 803 in the excitation wavelength at a high refresh rate (e.g., 60 Hz or higher), to display the annunciation information dynamically, in real time. Also, the example addressable display integrity system 800 is configured to display annunciation symbology in full color (e.g., R, G, B), by using three appropriate excitation wavelengths (e.g., a first select wavelength, a second select wavelength, and a third select wavelength) produced, respectively by three lighting devices 813, 815, 817 (e.g., laser diodes or LEDs) in an example lighting source 812, combining two or more of the first select wavelength, the second select wavelength, and the third select wavelength into a combined excitation beam using a beam combiner 819, and projecting the combined excitation beam onto overlapping layers of red, green and blue emitting fluorescent nanoparticle phosphor coatings on the transparent surface 824.

Figure 8B:
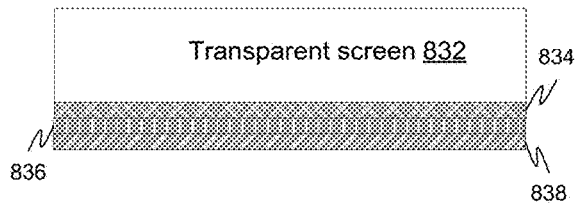
FIG. 8B is a diagram depicting a cross-sectional view of a transparent screen, with overlapping fluorescent emitting nanoparticle coatings, for allowing annunciation symbology to be displayed in multiple colors, in accordance with various embodiments.

FIG. 8B is a diagram depicting a cross-sectional view of a transparent surface 832, with overlapping fluorescent emitting nanoparticle coatings, for allowing annunciation symbology to be displayed in multiple colors. Depicted is a transparent surface 832 with a first nanoparticle coating 834 applied to a surface of the transparent surface 832, a second nanoparticle coating 836 applied over the first nanoparticle coating 834, and a third nanoparticle coating 838 applied over the second nanoparticle coating 836. This configuration may allow the transparent surface 832 to emit light in a first color via the first nanoparticle coating 834 when activated by a first select excitation wavelength, emit light in a second color via the second nanoparticle coating 836 when activated by a second select excitation wavelength, emit light in a third color via the third nanoparticle coating 838 when activated by a third select excitation wavelength, and emit light in other colors via two or more of the first nanoparticle coating 834, the second nanoparticle coating 836, and the third nanoparticle coating 838, when activated by two or more of the first select excitation wavelength, the second select excitation wavelength, and the third select excitation wavelength.

Figure 9:
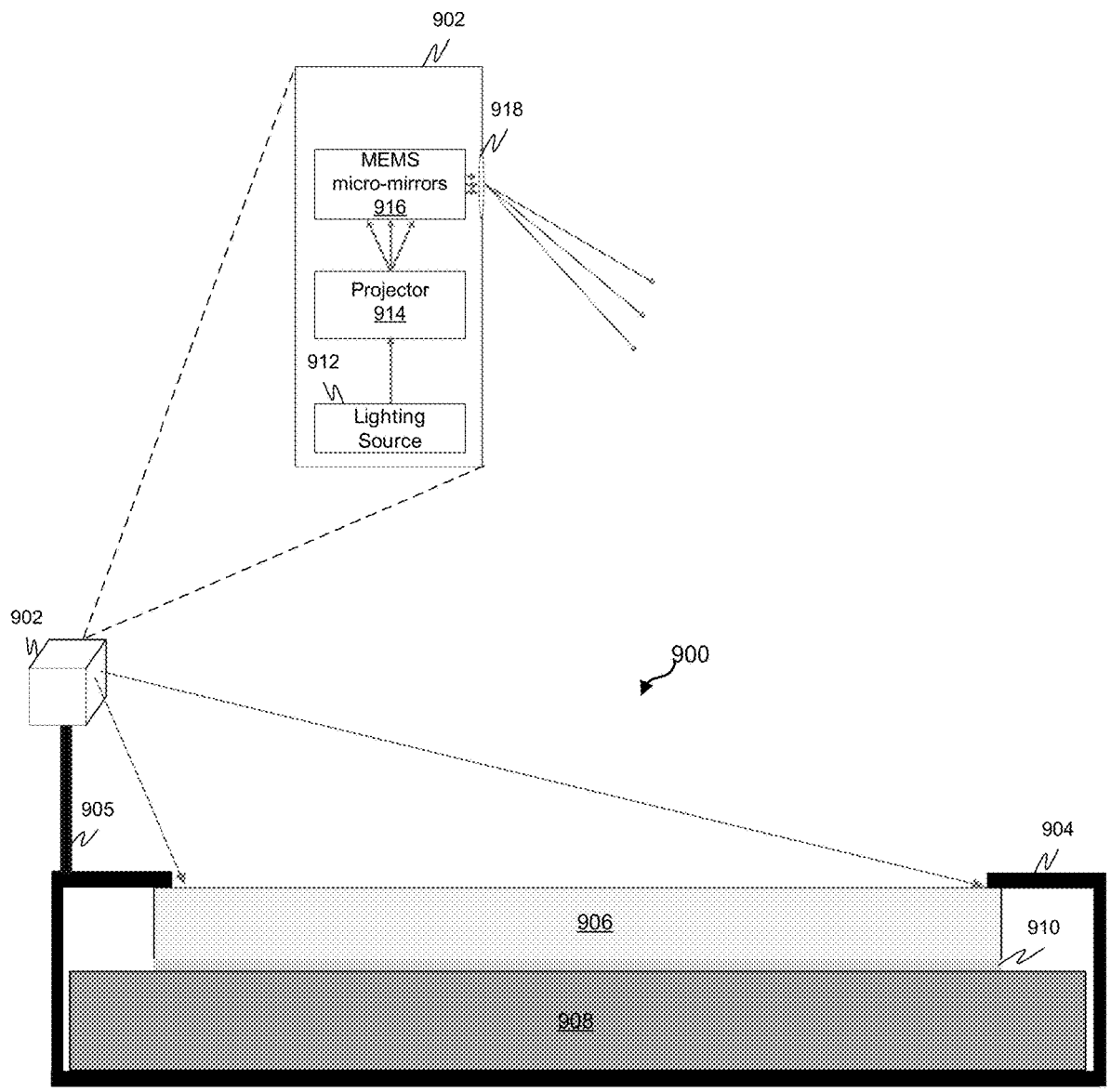
FIG. 9 is a block diagram depicting another example lighting system in an addressable display integrity system that is mounted on an example mounting adapter, in accordance with various embodiments.

FIG. 9 is a block diagram depicting another example lighting system 902 in an addressable display integrity system 900 that is mounted on an example mounting adapter 904 via a mount 905. The example addressable display integrity system 900 comprises the example lighting system 902, a transparent surface 906, and an imaging device (e.g., a camera) (not shown).

The example lighting system 902 is configured to direct light (e.g., predominantly non-visible light) in an excitation wavelength (e.g., 405 nm) to selective regions on the transparent surface 906 (e.g., glass or plastic substrate) that overlays a PED display 908 for a PED positioned in the mounting adapter 904. The example lighting system 902 is mounted on a side of the mounting adapter 904 in an unobtrusive way and is configured to not interfere with PED operations. An imaging device trained on the transparent surface 906 may be mounted next to the lighting system 902 to capture an image on the PED for comparison with an expected image for integrity check and annunciation.

The transparent surface 906 includes a coating 910 that when activated by a select waveform emits light. The coating when activated can be used to annunciate failures in ICA of certified information displayed on the PED. The example transparent surface 906 may be as thin as 0.025 mm when using a thin plastic substrate with the fluorescent nanoparticle coatings, and as thick as 0.5 mm when using a glass with the phosphor nanoparticle coating, while not interfering with the Tablet PC touch screen operation.

The example lighting system 902 comprises a MEMS micro-projector module and includes a lighting source 912, such as an LED or laser diode, a projector module 914, a MEMS micro-mirror module 916, and projector optics (e.g., one or more lenses) 918. The lighting source 912 is configured to emit an excitation beam of light (e.g., predominantly non-visible light) in the excitation wavelength (e.g., in the UVA band) when activated to illuminate the transparent screen 906 and its phosphor nanoparticle coating 910.

The MEMS micro-mirror module 916 may comprise several hundred thousand microscopic mirrors arranged in a rectangular array wherein each mirror corresponds to a pixel in an image to be displayed. Each mirror can be individually rotated to an on or off state to set the state of the pixel. In the on state, light from the projector module 914 is reflected by the micro-mirror into the projector optics 918 and onto the screen 906. In the off state, the light is directed elsewhere making the pixel appear dark. Light reflected from the micro-mirrors are projected onto the transparent screen 906 via the projector optics 918. Each micro-mirror is individually addressable allowing the pixels on the transparent screen 906 to be individually addressable. Desired symbology and/or text for annunciation can be written to the pixels represented by the micro-mirrors and projected onto the transparent screen 906 to illuminate selective regions of the transparent screen 906 to write desired symbology for annunciation.

The projector module 914 is configured to collect the light from the lighting source 912, direct the light to the micro-mirror module 916, and cause specific micro-mirrors to turn on or off to allow different annunciation symbology to be written onto the transparent screen 906. The light from the lighting source 912 activates the fluorescent phosphor nanoparticle coating 910 to emit visible light to provide the annunciation message. The wavelength(s) used by the lighting source 912 may be chosen to match the unique wavelengths needed to activate the fluorescent nanoparticle phosphor screens.

The lighting source 912 may comprise one or more lighting devices (e.g., laser diodes or LEDs) and can allow the example addressable display integrity system 900 to display annunciation symbology in full color (e.g., R, G, B), by providing appropriate excitation wavelengths. For example, the lighting source 912 may comprise three lighting devices that provide three different excitation wavelengths (e.g., a first select wavelength, a second select wavelength, and a third select wavelength) to produce multiple colors in combination with fluorescent nanoparticle coatings on the transparent surface 906.

Because the example lighting system 902 is offset from the transparent surface 906, the projected image from the excitation wavelengths may be geometrically distorted and the projected image may need to be geometrically compensated (e.g., keystone compensated). The example projector module 914 in the example lighting system 902 is configured to perform geometric compensation. In one example, the example projector module 914 is configured to perform geometric compensation by allocating more pixels in rows in the transparent screen 906 that are closest to the lighting system 902 and allocating fewer pixels in rows as the rows mover further away from the lighting system 902. The allocation of pixels to rows is done by adjusting the number of micro-mirrors used to project the excitation wavelength image.

Figure 10:
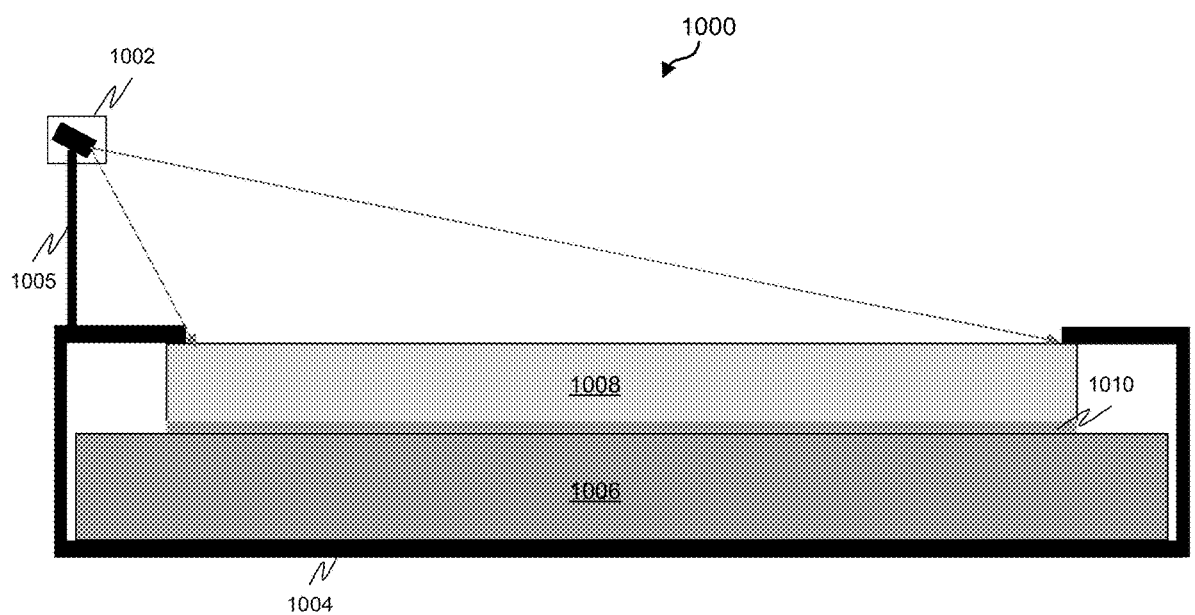
FIG. 10 is a block diagram depicting an example imaging device in an example display integrity system mounted to an example mounting adapter, in accordance with various embodiments.

FIG. 10 is a block diagram depicting an example imaging device 1002 in an example display integrity system 1000 mounted to an example mounting adapter 1004 via a mounting post 1005. The imaging device 1002 (e.g., a camera) captures the image on the PED 1006 for transmission to a server (e.g., server 102) that transmitted the image to be displayed on the PED 1006 wherein the server can compare the detected image with the expected image for integrity checking and annunciation. The example imaging device 1002 is mounted on a side of the mounting adapter 1004, next to the MEMS module (not shown), in an unobtrusive way and is configured to not interfere with PED operations. Because the imaging device 1002 captures the image displayed on the PED, off-axis, the image may need to be distortion compensated prior to comparing it with the expected image. The distortion compensation may be performed by the example imaging device 1002 (e.g., by the monitoring module 404 in the adapter controller 402) prior to transmission of the image to a server (e.g., application server 102) for comparison with the expected image or may be performed by the server. A transparent screen 1008 with a coating 1010 is provided to annunciate failures in ICA of certified information displayed on the PED. The transparent screen 1008 may be enabled to display annunciation symbology when ICA is lost. Thus, the transparent screen 1008 is not activated during normal operation of the overall system for certified aeronautical applications, while the imaging device 1002 is constantly monitoring the integrity of the data being displayed on the PED display.

Figure 11:
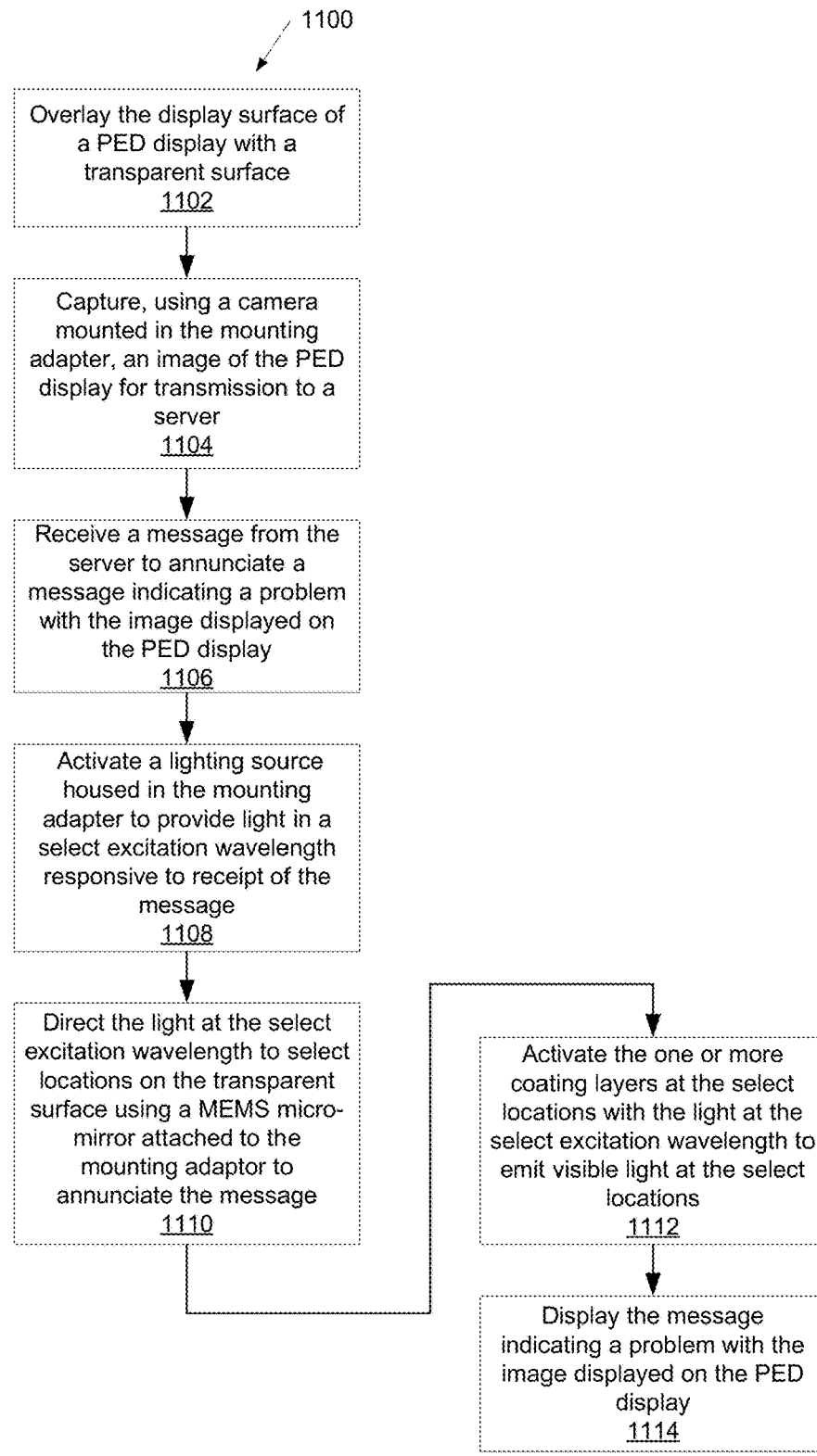
FIG. 11 is a process flowchart depicting an example process for of providing an addressable display system in a mounting adapter configured to mount a personal electronic device (PED) on an aircraft, in accordance with various embodiments.

FIG. 11 is a process flowchart depicting an example process 1100 for providing an addressable display system in a mounting adapter configured to mount a personal electronic device (PED) on an aircraft. The example process 1100 includes overlaying the display surface of a PED display with a transparent surface when the PED is mounted in the mounting adapter (operation 1102). The transparent surface includes a region that occupies a substantial portion of the transparent surface that is uniformly coated with one or more coating layers that when activated with a select excitation wavelength are configured to emit visible light to annunciate a message. The one or more coating layers may comprise fluorescent phosphor nanoparticles. The one or more coating layers may include a first, second, and third overlapping coating layer wherein the first coating layer is configured to emit light in a red color when activated by a first select wavelength, the second coating layer is configured to emit light in a green color when activated by a second select wavelength, and the third coating layer is configured to emit light in a blue color when activated by a third select wavelength.

The example process 1100 includes capturing, using a camera mounted in the mounting adapter, an image of the PED display for transmission to a server (operation 1104). The server is the server that transmitted data for display on the PED display, configured to perform an integrity check of the displayed data, and configured to cause the annunciation of a message when a problem is detected with the image of the PED display. The example process 1100 also includes receiving a message from the server to annunciate a message indicating a problem with the image displayed on the PED display (operation 1106), when the server detects a problem with the image of the PED display.

The example process 1100 includes activating a lighting source housed in the mounting adapter to provide light in a select excitation wavelength responsive to receipt of the message (operation 1108). The lighting source may include an LED (light emitting diode) or a laser diode. The lighting source may operate in a predominantly non-visible light band (e.g., 320-425 nm). The lighting source may include a first lighting device configured to emit light at the first select wavelength, a second lighting device configured to emit light at the second select wavelength, and a third lighting device configured to emit light at the third select wavelength. The process may further include combining two or more of the first select wavelength, the second select wavelength, and the third select wavelength into a combined excitation beam. The process may further include directing the combined excitation beam to MEMS micro-mirrors to annunciate the message in one or more different colors The example process 1100 includes directing the light at the select excitation wavelength to select locations on the transparent surface using a dual-axis scanned MEMS micro-mirror attached to the mounting adaptor to annunciate the message (operation 1110). The process may further include performing geometric compensation of the scan angles of the dual-axis scanned MEMS micro-mirror to correct for geometric distortion of the excitation wavelength image directed to the transparent surface.

The example process 1100 includes activating the one or more coating layers at the select locations with the light at the select excitation wavelength to emit visible light at the select locations (operation 1112) and displaying the message indicating a problem with the image displayed on the PED display (operation 1114).

Apparatus, systems, methods, techniques and articles are described for a system that enables a low-cost, non-certified commercial PED to display certified aeronautical information such as airport moving maps (AMM), air traffic (CDTI), and advanced weather radar information. Apparatus, systems, methods, techniques and articles are described for a system that may verify and annunciate the Integrity, Continuity and Availability (ICA) of the non-certified, low-cost, commercial PED system for use in certified aeronautical applications.

Apparatus, systems, methods, techniques and articles are described for an addressable, low-cost display system mounted on a mounting adapter to annunciate the ICA status of a PED and other information. The addressable display system can be a critical enabler for a system that can realize significant cost savings by allowing the use of a low-cost, commercial PED for high integrity applications (as well as low-integrity applications). The described apparatus, systems, methods, techniques and articles may provide an addressable transparent display overlaid on the display of a commercial PED, in a very compact form factor, without impacting the image quality and functionality of the PED display.

The described apparatus, systems, methods, techniques and articles may also be applicable for other applications. For example, the described apparatus, systems, methods, techniques and articles may also be used for other cockpit applications such as projected standby instruments, transparent windscreen displays and for a myriad of other applications requiring fully addressable, scalable transparent displays. If the described apparatus, systems, methods, techniques and articles are used for projected standby instruments, the display surface (or screen) may not need to be transparent, in which case the transparency attribute of the display surface (or screen) can be removed by using an opaque substrate for a display screen.

Also, the addressable display screen disclosed by the described apparatus, systems, methods, techniques and articles can be made transparent or opaque by laminating the display screen on an electrochromic window substrate. The transmission through the electrochromic window can be controlled from transparent (e.g., >70% transmission) to opaque (e.g., <0.0001% transmission).

In one embodiment, an addressable display system configured for use in a mounting adapter configured to mount a personal electronic device (PED) on an aircraft is disclosed. The display system comprises a transparent surface configured to overlay the display surface of a PED when the PED is mounted in the mounting adapter. The transparent surface includes a region that occupies a substantial portion of the transparent surface that is uniformly coated with one or more coating layers that when activated with a select excitation wavelength are configured to emit visible light to annunciate a message. The display system further comprises a lighting source mounted on the mounting adapter and configured to provide light in the excitation wavelength when activated to illuminate the transparent surface; a MEMS (microelectromechanical systems) scanner module mounted on the mounting adapter, trained on the display screen, and controllable to write desired symbology for annunciation using the select excitation wavelength on the one or more coating layers at different addressable locations on the transparent surface; and an imaging device mounted in the mounting adapter and configured to capture an image of the PED display for transmission to a server that transmitted data for display on the PED display for performing an integrity check of the displayed data and for activating the lighting source when a problem is detected with the image of the PED display.

These aspects and other embodiments may include one or more of the following features. The transparent surface may be fixed in the mounting adaptor. The transparent surface may be configured to be laminated on the PED display. The one or more coating layers may comprise fluorescent phosphor nanoparticles. The lighting source may comprise an LED (light emitting diode) or a laser diode. The lighting source may operate in a predominantly non-visible light band. The MEMS module may comprise a MEMS micro-mirror that is controllable to direct light in the select excitation wavelength to illuminate different addressable locations on the transparent surface to write desired symbology for annunciation. The MEMS module may comprise a dual-axis MEMS scanner module that includes a MEMS micro-mirror that is controllable to scan the excitation wavelength in the x-y directions to write different annunciation symbology at different addressable locations on the transparent surface. The dual-axis MEMS scanner module may further comprise a MEMS controller that is configured to control the movement of the micro-mirrors in the x-y directions to allow different annunciation symbols to be written onto the transparent surface at different addressable locations. The MEMS controller may comprise a geometric compensation module that is configured to perform scan angle compensation for the dual-axis scanned MEMS micro-mirror to correct for geometric distortion of the annunciation symbology created on the transparent surface. The one or more coating layers may comprise a first, second, and third overlapping coating layer wherein the first coating layer is configured to emit light in a red color when activated by a first select wavelength, the second coating layer is configured to emit light in a green color when activated by a second select wavelength, and the third coating layer is configured to emit light in a blue color when activated by a third select wavelength. The lighting source may comprise a first lighting device configured to emit light at the first select wavelength, a second lighting device configured to emit light at the second select wavelength, and a third lighting device configured to emit light at the third select wavelength. The lighting source may comprise a beam combiner configured to direct an excitation wavelength to the MEMS micro-mirrors that includes a combination of two or more of the first select wavelength, the second select wavelength, and the third select wavelength. The transparent surface may have a transmittance greater than 60% in the visible wavelength range when inactive. The coating layers may be configured to display desired symbology to annunciate the loss of integrity and availability when activated. The transparent surface may be configured to allow touchscreen gestures on the PED display. The integrity check of the displayed data on the PED may include a comparison of the image on the PED with the transmitted data from the server. The MEMS module may comprise a MEMS projector module, a MEMS micro-mirror module that includes a plurality of micro-mirrors, and projector optics that are controllable to project light in the select excitation wavelength to illuminate different addressable locations on the transparent surface to write desired symbology for annunciation. Each micro-mirror in the MEMS micro-mirror module may be individually addressable and can be configured to represent a pixel in a projected image. The MEMS projector module may be configured to collect light from the lighting source, direct the light to the MEMS micro-mirror module, and cause individual micro-mirrors in the MEMS micro-mirror module to turn on or off to cause different annunciation symbology to be written on the transparent surface. The MEMS projector module may be configured to perform geometric compensation to correct for geometric distortion of the annunciation symbology by adjusting the number of micro-mirrors used to project an excitation wavelength image onto the transparent surface.

In another embodiment, a method of providing an addressable display system in a mounting adapter configured to mount a personal electronic device (PED) on an aircraft is disclosed. The method comprises overlaying the display surface of a PED display with a transparent surface when the PED is mounted in the mounting adapter wherein the transparent surface includes a region that occupies a substantial portion of the transparent surface that is uniformly coated with one or more coating layers that when activated with a select excitation wavelength are configured to emit visible light to annunciate a message. The method further comprises capturing, using a camera mounted in the mounting adapter, an image of the PED display for transmission to a server that transmitted data for display on the PED display for performing an integrity check of the displayed data and for causing the annunciation of a message when a problem is detected with the image of the PED display; receiving a message from the server to annunciate a message indicating a problem with the image displayed on the PED display; activating a lighting source housed in the mounting adapter to provide light in a select excitation wavelength responsive to receipt of the message; directing the light at the select excitation wavelength to select locations on the transparent surface using a dual-axis scanned MEMS (microelectromechanical systems) micro-mirror attached to the mounting adaptor to annunciate the message; activating the one or more coating layers at the select locations with the light at the select excitation wavelength to emit visible light at the select locations; and displaying the message indicating a problem with the image displayed on the PED display.

These aspects and other embodiments may include one or more of the following features. The one or more coating layers may comprise fluorescent phosphor nanoparticles. The lighting source may comprise an LED (light emitting diode) or a laser diode. The lighting source may operate in a predominantly non-visible light band. The method may further comprise performing geometric compensation of the scan angles of the dual-axis scanned MEMS micro-mirror to correct for geometric distortion of the excitation waveform image directed to the transparent surface. The one or more coating layers may comprise a first, second, and third overlapping coating layer wherein the first coating layer is configured to emit light in a red color when activated by a first select wavelength, the second coating layer is configured to emit light in a green color when activated by a second select wavelength, and the third coating layer is configured to emit light in a blue color when activated by a third select wavelength. The lighting source may comprise a first lighting device configured to emit light at the first select wavelength, a second lighting device configured to emit light at the second select wavelength, and a third lighting device configured to emit light at the third select wavelength. The method may further comprise combining two or more of the first select wavelength, the second select wavelength, and the third select wavelength into a combined excitation beam and directing the combined excitation beam to the MEMS micro-mirror to annunciate the message in one or more different colors.

In another embodiment, an addressable display system configured for use on an aircraft is disclosed. The display system comprises a surface configured to overlay a display in the aircraft. The surface includes a region that occupies a substantial portion of the surface and that is uniformly coated with one or more coating layers that when activated with a select excitation wavelength are configured to emit visible light to annunciate a message. The display system further comprises a lighting source configured to provide light in the excitation wavelength when activated to illuminate the surface; a MEMS (microelectromechanical systems) micro-mirror that is controllable to scan the excitation wavelength in the x-y directions to write different annunciation symbology using the select excitation wavelength on the one or more coating layers at different addressable locations on the surface; a MEMS controller that is configured to control the movement of the MEMS micro-mirror in the x-y directions to allow different annunciation symbols to be written onto the surface at different addressable locations and comprising a geometric compensation module that is configured to perform geometric compensation of the MEMS micro-mirror scan angles to direct a geometric compensated excitation wavelength image onto the surface; and an imaging device configured to capture an image of the display for transmission to a server configured to analyze the image and configured to activate the lighting source when predetermined conditions are detected.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An addressable display system configured for use in a mounting adapter configured to mount a personal electronic device (PED) on an aircraft, the display system comprising:
   a transparent surface configured to overlay the display surface of a PED when the PED is mounted in the mounting adapter, the transparent surface including a region that occupies a substantial portion of the transparent surface that is uniformly coated with one or more coating layers that when activated with a select excitation wavelength are configured to emit visible light to annunciate a message;
   a lighting source mounted on the mounting adapter and configured to provide light in the excitation wavelength when activated to illuminate the transparent surface;
   a MEMS (microelectromechanical systems) module mounted on the mounting adapter, trained on the transparent surface, and controllable to write desired symbology for annunciation using the select excitation wavelength on the one or more coating layers at different addressable locations on the transparent surface; and
   an imaging device mounted in the mounting adapter and configured to capture an image of the PED display for transmission to a server that transmitted data for display on the PED display for performing an integrity check of the displayed data, for activating the lighting source, and for causing the MEMS module to write desired symbology on the one or more coating layers at different addressable locations to annunciate a message indicating a problem with the image displayed on the PED display when a problem is detected with the image of the PED display.

2. The addressable display system of claim 1, wherein the one or more coating layers comprise fluorescent phosphor nanoparticles.

3. The addressable display system of claim 1, wherein the lighting source comprises an LED (light emitting diode) or a laser diode.

4. The addressable display system of claim 1, wherein the lighting source operates in a predominantly non-visible light band.

5. The addressable display system of claim 1, wherein the MEMS module comprises a MEMS micro-mirror that is controllable to direct light in the select excitation wavelength to illuminate different addressable locations on the transparent surface to write desired symbology for annunciation.

6. The addressable display system of claim 5, wherein the MEMS module comprises a dual-axis MEMS scanner module that includes a MEMS micro-mirror that is controllable to scan the excitation wavelength in the x-y directions to write different annunciation symbology at different addressable locations on the transparent surface.

7. The addressable display system of claim 6, wherein the dual-axis MEMS scanner module further comprises a MEMS controller that is configured to control the movement of the micro-mirror in the x-y directions to allow different annunciation symbols to be written onto the transparent surface at different addressable locations.

8. The addressable display system of claim 7, wherein the MEMS controller comprises a geometric compensation module that is configured to perform scan angle compensation for the dual-axis scanned MEMS micro-mirror to correct for geometric distortion of the annunciation symbology created on the transparent surface.

9. The addressable display system of claim 1, wherein the one or more coating layers comprise a first, second, and third overlapping coating layer, the select excitation wavelength comprises a first, second, and third select wavelength, the first coating layer is configured to emit light in a red color when activated by the first select wavelength, the second coating layer is configured to emit light in a green color when activated by the second select wavelength, and the third coating layer is configured to emit light in a blue color when activated by the third select wavelength.

10. The addressable display system of claim 9, wherein the lighting source comprises a first lighting device configured to emit light at the first select wavelength, a second lighting device configured to emit light at the second select wavelength, and a third lighting device configured to emit light at the third select wavelength.

11. The addressable display system of claim 10, wherein the lighting source comprises a beam combiner configured to direct an excitation wavelength to the MEMS micro-mirrors that includes a combination of two or more of the first select wavelength, the second select wavelength, and the third select wavelength.

12. The addressable display system of claim 1, wherein the integrity check of the displayed data on the PED includes a comparison of image data from the image on the PED with the transmitted data from the server.

13. The addressable display system of claim 1, wherein the MEMS module comprises a MEMS projector module, a MEMS micro-mirror module that includes a plurality of micro-mirrors, and projector optics that are controllable to project light in the select excitation wavelength to illuminate different addressable locations on the transparent surface to write desired symbology for annunciation.

14. The addressable display system of claim 13, wherein each micro-mirror in the MEMS micro-mirror module is individually addressable and can be configured to represent a pixel in a projected image.

15. The addressable display system of claim 14, wherein the MEMS projector module is configured to collect light from the lighting source, direct the light to the MEMS micro-mirror module, and cause individual micro-mirrors in the MEMS micro-mirror module to turn on or off to cause different annunciation symbology to be written on the transparent surface.

16. The addressable display system of claim 15, wherein the MEMS projector module is configured to perform geometric compensation to correct for geometric distortion of the annunciation symbology by adjusting the number of micro-mirrors used to project an excitation wavelength image onto the transparent surface.

17. A method of providing an addressable display system in a mounting adapter configured to mount a personal electronic device (PED) on an aircraft, the method comprising:
   overlaying the display surface of a PED display with a transparent surface when the PED is mounted in the mounting adapter, the transparent surface including a region that occupies a substantial portion of the transparent surface that is uniformly coated with one or more coating layers that when activated with a select excitation wavelength are configured to emit visible light to annunciate a message;
   providing a lighting source mounted on the mounting adapter and configured to provide light in the excitation wavelength when activated to illuminate the transparent surface;
   providing a MEMS (microelectromechanical systems) module mounted on the mounting adapter, trained on the transparent surface, and controllable to write desired symbology for annunciation using the select excitation wavelength on the one or more coating layers at different addressable locations on the transparent surface; and
   providing an imaging device mounted in the mounting adapter and configured to capture an image of the PED display for transmission to a server that transmitted data for display on the PED display for performing an integrity check of the displayed data, for activating the lighting source, and for causing the MEMS module to write desired symbology on the one or more coating layers at different addressable locations to annunciate a message indicating a problem with the image displayed on the PED display when a problem is detected with the image of the PED display.

18. The method of claim 17, wherein:
the MEMS module comprises a MEMS projector module, a MEMS micro-mirror module that includes a plurality of micro-mirrors, and projector optics that are controllable to project light in the select excitation wavelength to illuminate different addressable locations on the transparent surface to write desired symbology for annunciation;
each micro-mirror in the MEMS micro-mirror module is individually addressable and can be configured to represent a pixel in a projected image;
the MEMS projector module is configured to collect light from the lighting source, direct the light to the MEMS micro-mirror module, and cause individual micro-mirrors in the MEMS micro-mirror module to turn on or off to cause different annunciation symbology to be written on the transparent surface; and
the MEMS projector module is configured to perform geometric compensation to correct for geometric distortion of the annunciation symbology by adjusting the number of micro-mirrors used to project an excitation wavelength image onto the transparent surface.

19. The method of claim 18, wherein:
the one or more coating layers comprise a first, second, and third overlapping coating layer, the select excitation wavelength comprises a first, second, and third select wavelength, the first coating layer is configured to emit light in a red color when activated by the first select wavelength, the second coating layer is configured to emit light in a green color when activated by the second select wavelength, and the third coating layer is configured to emit light in a blue color when activated by the third select wavelength; and
the lighting source comprises a first lighting device configured to emit light at the first select wavelength, a second lighting device configured to emit light at the second select wavelength, and a third lighting device configured to emit light at the third select wavelength.

20. The method of claim 19, wherein the lighting source further comprises a beam combiner configured to direct an excitation wavelength to the MEMS micro-mirrors that includes a combination of two or more of the first select wavelength, the second select wavelength, and the third select wavelength to annunciate the message in one or more different colors.

* * * * *